(12) United States Patent
Long

(10) Patent No.: US 12,334,312 B2
(45) Date of Patent: Jun. 17, 2025

(54) CONFIGURABLE FARADAY SHIELD

(71) Applicants: Mattson Technology, Inc., Fremont, CA (US); Beijing E-Town Semiconductor Technology Co., Ltd., Beijing (CN)

(72) Inventor: Maolin Long, Santa Clara, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 409 days.

(21) Appl. No.: 17/544,433

(22) Filed: Dec. 7, 2021

(65) Prior Publication Data

US 2022/0208529 A1    Jun. 30, 2022

Related U.S. Application Data

(60) Provisional application No. 63/208,050, filed on Jun. 8, 2021, provisional application No. 63/130,990, filed on Dec. 28, 2020.

(51) Int. Cl.
*H01J 37/32* (2006.01)

(52) U.S. Cl.
CPC ...... *H01J 37/32651* (2013.01); *H01J 37/321* (2013.01)

(58) Field of Classification Search
None
See application file for complete search history.

(56) References Cited

U.S. PATENT DOCUMENTS

| | | | |
|---|---|---|---|
| 6,329,590 B1 * | 12/2001 | Alexander | H05K 9/0015 174/382 |
| 8,801,947 B2 | 12/2014 | Wang et al. | |
| 9,490,106 B2 | 11/2016 | Drewery et al. | |
| 10,790,119 B2 | 9/2020 | Ma et al. | |
| 2002/0129903 A1 * | 9/2002 | Davis | H01J 37/32082 156/345.48 |
| 2006/0174834 A1 * | 8/2006 | Long | C23C 16/507 156/345.48 |
| 2012/0031562 A1 | 2/2012 | Setsuhara et al. | |

(Continued)

FOREIGN PATENT DOCUMENTS

CN    109712859 A    5/2019

*Primary Examiner* — Jeffrie R Lund
*Assistant Examiner* — Tiffany Z Nuckols
(74) *Attorney, Agent, or Firm* — Dority & Manning, P.A.

(57) ABSTRACT

A configurable Faraday shield is provided. The configurable Faraday shield includes a plurality of ribs. Each of the ribs can be spaced apart from one another along a circumferential direction. Furthermore, at least a portion of the configurable Faraday shield is movable between at least a first position and a second position to selectively couple the configurable Faraday shield to a radio frequency ground plane. When the at least a portion of the configurable Faraday shield is in the first position, the configurable Faraday shield can be decoupled from the radio frequency ground plane such that the configurable Faraday shield is electrically floating. Conversely, when the at least a portion of the configurable Faraday shield is in the second position, the configurable Faraday shield can be coupled to the radio frequency ground plane such that the configurable Faraday shield is electrically grounded.

9 Claims, 14 Drawing Sheets

(56) References Cited

U.S. PATENT DOCUMENTS

| | | |
|---|---|---|
| 2012/0160806 A1 | 6/2012 | Godyak et al. |
| 2013/0323933 A1 | 12/2013 | Wang et al. |
| 2017/0372870 A1 | 12/2017 | Godyak et al. |
| 2018/0240652 A1 | 8/2018 | Ma et al. |
| 2018/0358204 A1 | 12/2018 | Ma et al. |
| 2018/0358206 A1 | 12/2018 | Ma et al. |
| 2018/0358208 A1 | 12/2018 | Ma et al. |
| 2018/0358210 A1 | 12/2018 | Ma et al. |
| 2020/0227239 A1 | 7/2020 | Savas et al. |
| 2020/0411297 A1 | 12/2020 | Peng et al. |
| 2021/0005431 A1 | 1/2021 | Ma et al. |
| 2021/0020404 A1 | 1/2021 | Savas et al. |
| 2021/0020411 A1 | 1/2021 | Savas et al. |
| 2021/0050213 A1 | 2/2021 | Savas et al. |

\* cited by examiner

CONFIGURABLE FARADAY SHIELD

PRIORITY CLAIM

The present application claims the benefit of priority of U.S. Provisional Application Ser. No. 63/130,990, titled "Configurable Faraday Shield", filed on Dec. 28, 2020, which is incorporated herein by reference. The present application claims the benefit of priority of U.S. Provisional Application Ser. No. 63/208,050, titled "Configurable Faraday Shield", filed on Jun. 8, 2021, which is incorporated herein by reference.

FIELD

The present disclosure relates generally to plasma processing apparatuses and, more particularly, a configurable faraday shield for plasma processing apparatuses.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing substrates. In plasma dry strip processes, neutral species (e.g., radicals) from a plasma generated in a remote plasma chamber pass through a separation grid into a processing chamber to treat a workpiece, such as a semiconductor wafer. In plasma etch processes, radicals, ions, and other species generated in a plasma directly exposed to the workpiece can be used to etch and/or remove a material on a workpiece.

SUMMARY

Aspects and advantages of embodiments of the present disclosure will be set forth in part in the following description, or may be learned from the description, or may be learned through practice of the embodiments.

In one aspect, a configurable Faraday shield is provided. The configurable Faraday shield includes a plurality of ribs. Each of the ribs can be spaced apart from one another along a circumferential direction. The configurable Faraday shield can include a plurality of conductive straps. The configurable Faraday shield can include a locking member movable between at least a first position and a second position to selectively couple each of the plurality of ribs to a radio frequency ground plane via a corresponding conductive strap of the plurality of conductive straps.

In another aspect, a method of operating a configurable Faraday shield of a plasma processing apparatus is provided. The method includes moving at least a portion of the configurable Faraday shield to a first position to decouple the configurable Faraday shield from a radio frequency ground plane such that the configurable Faraday shield is electrically floating during a first portion of a plasma treatment process for a workpiece disposed within a processing chamber of the plasma processing apparatus. The method includes applying radio frequency power to the configurable Faraday shield while the at least a portion of the configurable Faraday shield is in the first position. The method includes moving the at least a portion of the configurable Faraday shield from the first position to a second position to couple the configurable Faraday shield to the radio frequency ground plane such that the configurable Faraday shield is electrically grounded during a second portion of the plasma treatment process.

In yet another aspect, a plasma processing apparatus is provided. The plasma processing apparatus includes a plasma chamber. The plasma processing apparatus further includes an induction coil positioned outside of the plasma chamber. The plasma processing apparatus even further includes a configurable Faraday shield positioned outside of the plasma chamber such that the configurable Faraday shield is positioned between the induction coil and an exterior surface of the plasma chamber. The configurable Faraday shield includes a plurality of ribs spaced apart from one another. Furthermore, at least a portion of the configurable Faraday shield is movable between at least a first position and a second position to selectively couple the configurable Faraday shield to a radio frequency ground plane.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
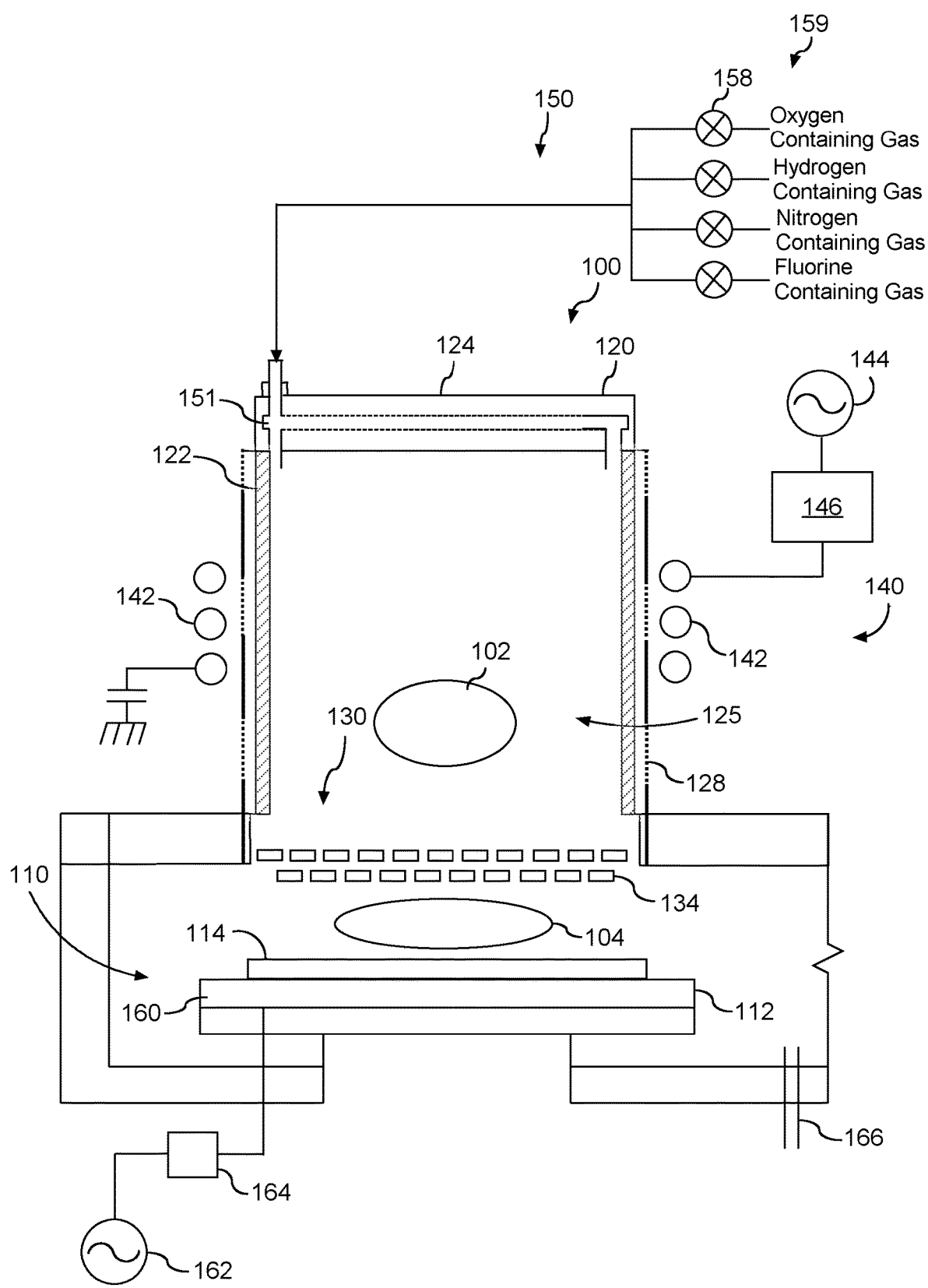
FIG. 1 depicts an example plasma processing apparatus according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed plasma processing apparatuses. Plasma processing apparatuses can include a Faraday shield that is electrically grounded. Alternatively, plasma processing apparatuses can include a Faraday shield that is not electrically grounded (e.g., floating). However, it would be desirable for plasma processing apparatuses to include a Faraday shield that can be selectively coupled to an electrical ground (e.g. radio frequency ground plane) so that it can be selectively grounded or selectively floating.

Example aspects of the present disclosure are directed to a configurable Faraday shield. The configurable Faraday shield can include a plurality of ribs. Each of the plurality of ribs can be spaced apart from one another. For instance, in some implementations, the plurality of ribs can be circumferentially spaced from one another. The configurable Faraday shield can include a plurality of conductive straps. In some implementations, each of the plurality of conductive straps can be coupled to a corresponding rib of the plurality of ribs.

In some implementations, the configurable Faraday shield can include a locking member. The locking member can be movable between at least a first position and a second position to selectively couple the plurality of ribs to a radio frequency ground plane via a corresponding conductive strap of the plurality of conductive straps. For instance, in some implementations, the locking member can define a plurality of notches. When the locking member is in the first position, each of the plurality of conductive straps can be positioned with a corresponding notch of the plurality of notches such that the plurality of conductive straps do not contact (e.g., touch) the radio frequency ground plane. In this manner, the plurality of ribs can be decoupled from the radio frequency ground plane such that the Faraday shield is electrically floating (e.g., not electrically grounded).

In some implementations, the locking member can be rotated about an axis and moved (e.g., translated) along the axis to move from the first position to the second position. When the locking member is in the second position, the locking member presses a portion of each of the plurality of conductive straps against the radio frequency ground plane. In this manner, each of the plurality of ribs can be electrically coupled to the radio frequency ground plane via a corresponding conductive strap of the plurality of conductive straps such that the Faraday shield is electrically grounded.

The configurable Faraday shield according to example embodiments of the present disclosure can provide numerous benefits and technical effects. For instance, the locking member can move between a first position and a second position to selectively couple ribs of the Faraday shield to the radio frequency ground plane. In this manner, a process window of plasma processing apparatuses having the configurable Faraday shield according to example embodiments of the present disclosure can be expanded since the Faraday shield can be grounded or floated via movement of the locking member. For instance, the locking member can move to the first position to electrically float the Faraday shield during a plasma striking window of a plasma treatment process (e.g., strip, etch) to reduce an amount of radio frequency power consumed during the plasma striking process. Conversely, the locking member can move to the second position to electrically ground the Faraday shield during a plasma sustain window of the plasma treatment process.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

Referring now to the FIGS., FIG. 1 depicts an example plasma processing apparatus 100 that can be used to implement plasma treatment processes (e.g., etch, strip) on a workpiece (e.g., semiconductor wafer) according to example embodiments of the present disclosure. The plasma processing apparatus 100 can include a processing chamber 110 and a plasma chamber 120 that is separated from the processing chamber 110. For instance, the plasma processing apparatus 100 can include a separation grid assembly 130 that is configured to separate the processing chamber 110 from the plasma chamber 120.

In some implementations, the separation grid assembly 130 can include at least a first grid plate 132 and a second grid plate 134. The first grid plate 132 and the second grid plate 134 can be arranged relative to one another such that the first grid plate 132 and the second grid plate 134 are substantially parallel to one another. The first grid plate 132 can have a first grid pattern having a plurality of holes. The second grid plate 134 can have a second grid pattern having a plurality of holes. In some implementations, the first grid pattern can be the same as the second grid pattern. In alternative implementations, the first grid pattern can be different than the second grid pattern.

Charged particles (e.g., ions) can recombine on the walls in their path through the holes of each grid plate 132, 134 in the separation grid assembly 130. Neutral species (e.g., radicals) can flow relatively freely through the holes in the first grid plate 132 and the second grid plate 134.

As shown, the plasma processing apparatus 100 can include a workpiece support 112 (e.g., pedestal) disposed within the processing chamber 110. The workpiece support 112 can support a workpiece 114 to be processed, such as a semiconductor wafer. In this example illustration, a remote plasma 102 is generated in the plasma chamber 120 (i.e., plasma generation region) by an inductively coupled plasma source 140 and desired species are channeled through the separation grid assembly 130 and onto the workpiece 114.

The plasma chamber 120 can include a dielectric side wall 122 and a ceiling 124. The dielectric side wall 122, ceiling 124, and separation grid assembly 130 can define a plasma chamber interior 125. The dielectric side wall 122 can be formed from a dielectric material, such as quartz and/or alumina. In alternative implementations, the dielectric side wall 122 can be formed from a ceramic material. The inductively coupled plasma source 140 can include an induction coil 142 disposed adjacent the dielectric side wall 122 about the plasma chamber 120. The induction coil 142 can be electrically coupled to an RF power generator 144 through a suitable matching network 146.

Process gases can be provided to the plasma chamber interior 125 from gas supply 150 and gas distribution channel 151 or other suitable gas introduction mechanism. When the induction coil 142 is energized with RF power from the RF power generator 144, the remote plasma 102 can be generated in the plasma chamber 120. In a particular embodiment, the plasma processing apparatus 100 can include a grounded Faraday shield 128 positioned to reduce capacitive coupling of the induction coil 142 to the remote plasma 102. For instance, the grounded Faraday shield 128 can be positioned between the induction coil and an exterior surface of the dielectric sidewall 122 of the plasma chamber 120. While one induction coil 142 is shown, the disclosure is not so limited. Indeed, any number of induction coils or induction coil assemblies can be utilized herein in order to generate the remote plasma 102 in the plasma chamber 120.

The plasma processing apparatus 100 is operable to generate the remote plasma 102 (e.g., a remote plasma) in the plasma chamber 120. In addition, the plasma processing apparatus 100 is operable to generate a direct plasma 104 in the processing chamber 110. The remote plasma 102 can be generated by an inductively coupled plasma source. The direct plasma 104 can be generated by, for instance, a capacitively coupled plasma source (e.g., bias in conjunction with a grounded shield).

More particularly, the plasma processing apparatus 100 includes a bias source having a bias electrode 160 in the workpiece support 112. The bias electrode 160 can be coupled to an RF power generator 162 via a suitable matching network 164. When the bias electrode 160 is energized with RF energy, the direct plasma 104 can be generated from the filtered mixture or process gas in the processing chamber 110 for direct exposure to the workpiece 114. The processing chamber 110 can include a gas exhaust port 166 for evacuating a gas from the processing chamber 110.

In some embodiments, the workpiece support 112 is configured such that a DC bias can be applied to the workpiece 114. In some embodiments, DC power is applied to the bias electrode 160 located in the workpiece support 112. The DC bias can be applied to generate an electric field such that certain species can be attracted and/or accelerated towards the workpiece 114. With application of a DC bias to the workpiece 114, the flux of certain ionic species can be controlled. This can facilitate polymer film growth or radical etching on the structure of the workpiece 114. In some embodiments, the DC bias applied or provided to the bias electrode is from about 50 W to about 150 W. The DC bias may be applied to the workpiece 114 to accelerate certain species from the first plasma 502 and/or the second plasma 504 towards the workpiece 114.

As shown in FIG. 1, according to example aspects of the present disclosure, the plasma processing apparatus 100 can include a gas delivery system configured to deliver process gas to the plasma chamber 120, for instance, via a gas distribution channel 151 or other distribution system (e.g., showerhead). The gas delivery system can include a plurality of feed gas lines 159. The feed gas lines 159 can be controlled using valves 158 and/or gas flow controllers to deliver a desired amount of gases into the plasma chamber 120 as process gas. The gas delivery system can be used for the delivery of any suitable process gas. Example process gases include, oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some implementations, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. In embodiments, the gas delivery system can be controlled with a gas flow controller.

Figure 2:
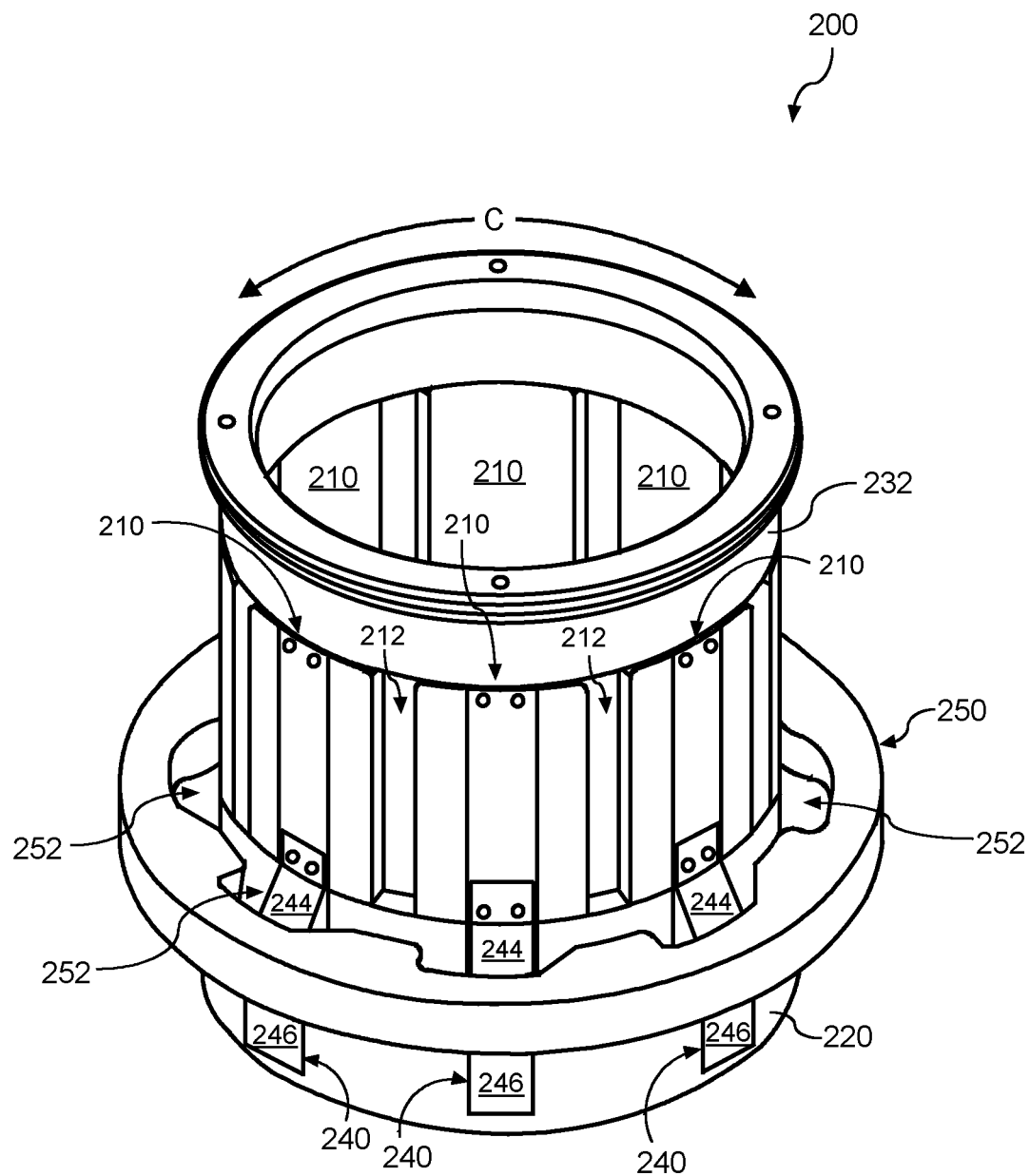
FIG. 2 depicts a configurable Faraday shield having a movable member in a first position according to example embodiments of the present disclosure.
Figure 3:
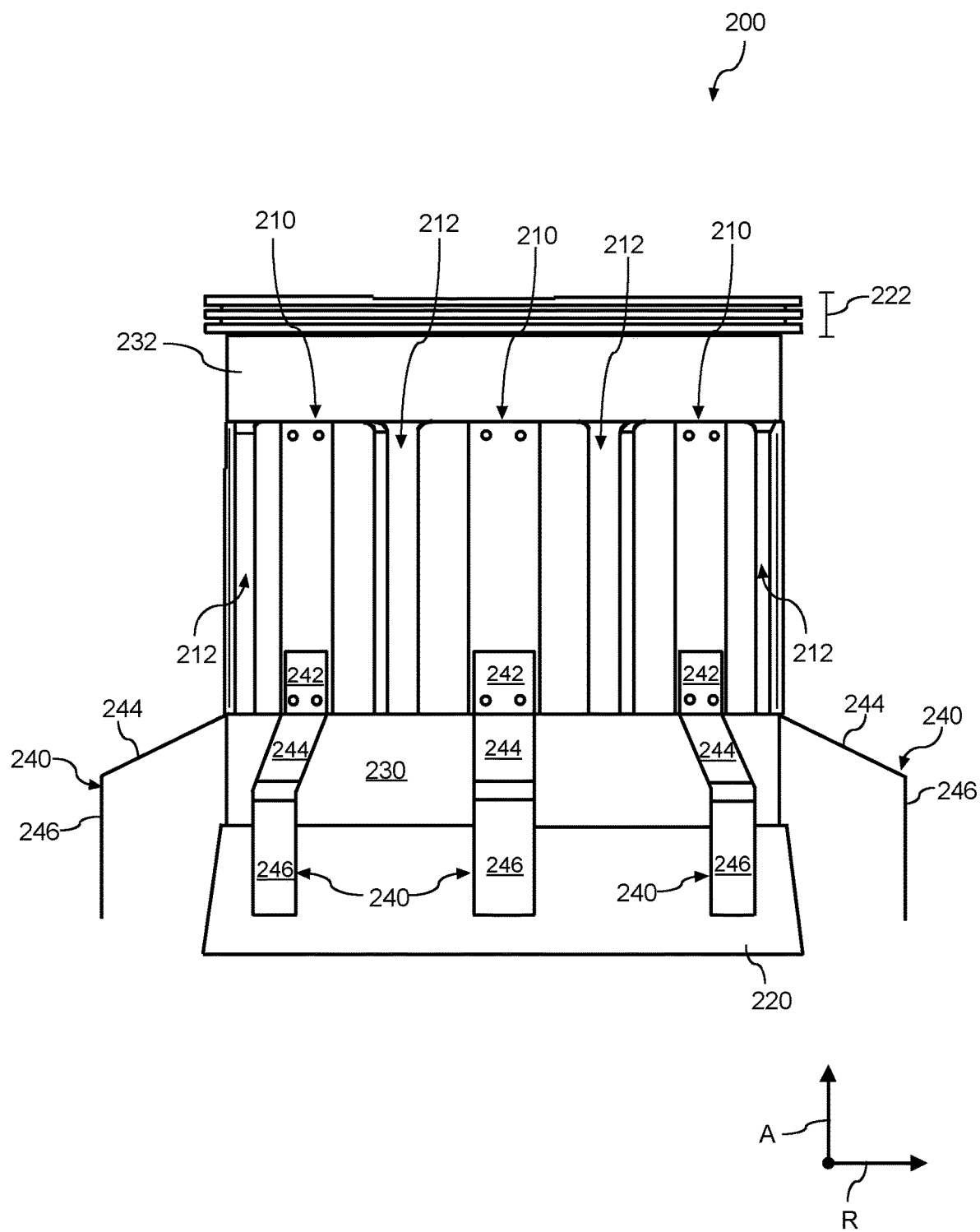
FIG. 3 depicts the configurable Faraday shield of FIG. 2 without the locking member according to example embodiments of the present disclosure.
Figure 4:
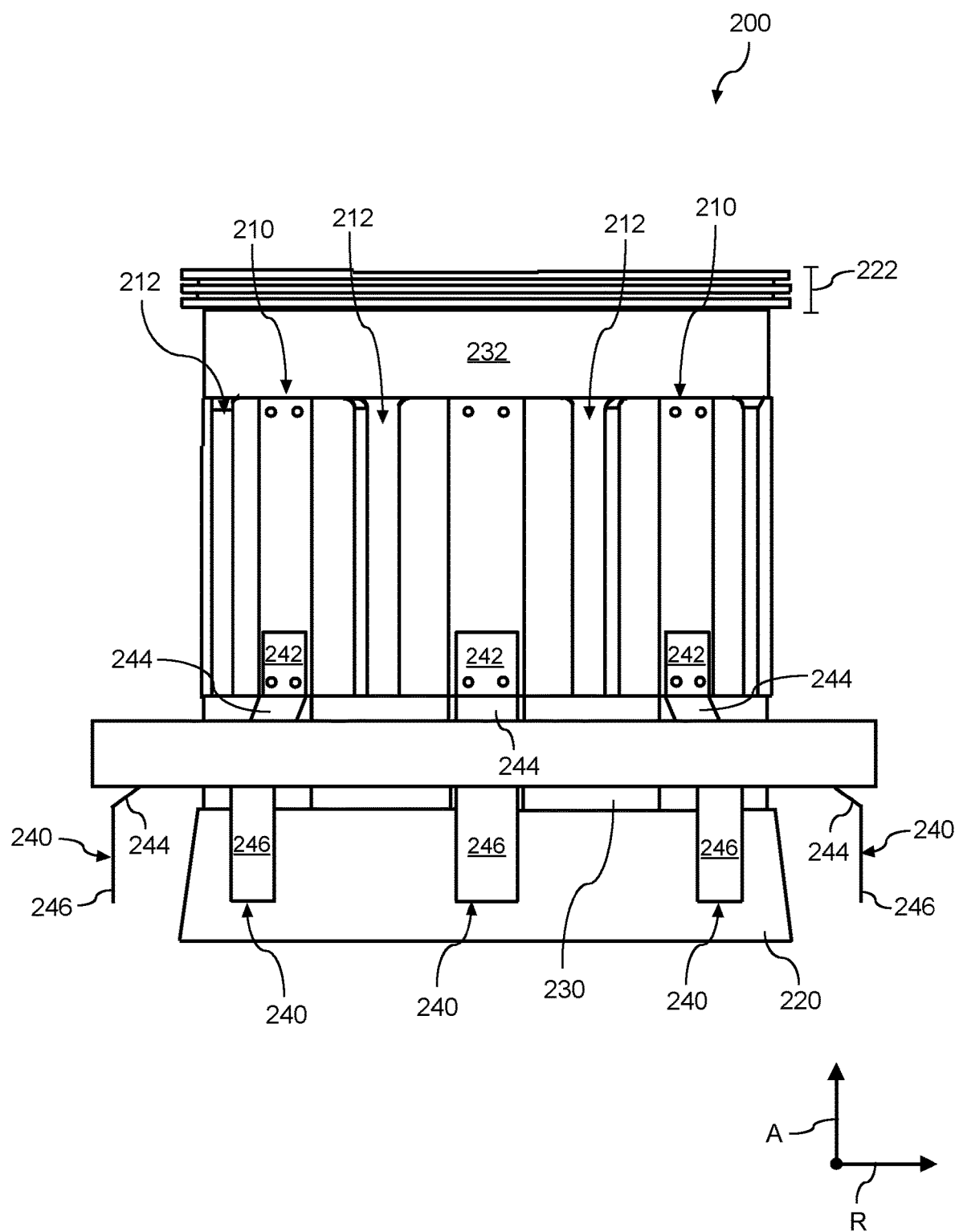
FIG. 4 depicts a side view of FIG. 2 according to example embodiments of the present disclosure.

Referring now to FIGS. 2 through 4, a configurable Faraday shield 200 is provided according to an example embodiment of the present disclosure. It should be understood that the configurable Faraday shield 200 can be used in place of the grounded Faraday shield 128 discussed above with reference to FIG. 1. The configurable Faraday shield 200 defines an axial direction A, a circumferential direction C, and a radial direction R. The configurable Faraday shield 200 can include a plurality of ribs 210. As shown, each of the ribs 210 can be spaced apart from one another along the circumferential direction C. In this manner, an air gap 212 can be defined between adjacent ribs 210.

In some implementations, the plurality of ribs 210 can be coupled between a first RF ground plane 220 of the configurable Faraday shield 200 and a second RF ground plane 222 of the configurable Faraday shield 200 along the axial direction A. Furthermore, in some implementations, the configurable Faraday shield 200 can include a first dielectric spacer 230 and a second dielectric spacer 232 that is spaced apart from the first dielectric spacer 230 along the axial direction A. It should be appreciated that the first dielectric spacer 230 and the second dielectric spacer 232 can be formed from any suitable dielectric material. In some implementations, the first dielectric spacer 230 can be coupled between the first RF ground plane 220 and the plurality of ribs 210 along the axial direction A. Furthermore, the second dielectric spacer 232 can be coupled between the second RF ground plane 222 and the plurality of ribs 210 along the axial direction A.

The configurable Faraday shield 200 can include a plurality of conductive straps 240. In some implementations, each of the conductive straps 240 can be coupled to a corresponding rib 210 of the plurality of ribs 210. As shown, each of the plurality of conductive straps 240 can have a first portion 242, a second portion 244, and a third portion 246. In some implementations, the first portion 242 of each of the conductive straps 240 can be coupled to a corresponding rib of the plurality of ribs 210 (FIG. 3). The second portion 244 can be bent relative to the first portion 242. For instance, in some implementations, the second portion 244 can be bent at an angle greater than 90 degrees. The third portion 246 can be bent relative to the second portion 244 such that the third portion 246 is substantially parallel to the first portion 242. In some implementations, at least one of the plurality of conductive straps 240 can include Beryllium copper (BeCu). It should be understood that the plurality of conductive straps 240 can include any suitable conductive material. Alternatively, or additionally, a thickness of each of the plurality of conductive straps 240 can range from about 2 millimeter to about 15 millimeters.

The configurable Faraday shield 200 can include a locking member 250. In some implementations, the locking member 250 can define a plurality of notches 252. As shown, the locking member 250 is in a first position in which each of the plurality of conductive straps 240 is positioned with a corresponding notch of the plurality of notches 252 such that the plurality of conductive straps 240 do not contact (e.g., touch) the first RF ground plane 220. In this manner, the plurality of ribs 210 can be decoupled from the first RF ground plane 220 such that the configurable Faraday shield 200 is electrically floating (e.g., not electrically grounded). As will be discussed below, the locking member 250 can move to a second position (FIGS. 7 and 8) to couple each of the plurality of ribs 210 to a RF ground plane (e.g., first RF ground plane 220) via a corresponding conductor of the plurality of conductive straps 240 such that the configurable Faraday shield 200 is electrically grounded.

Figure 5:
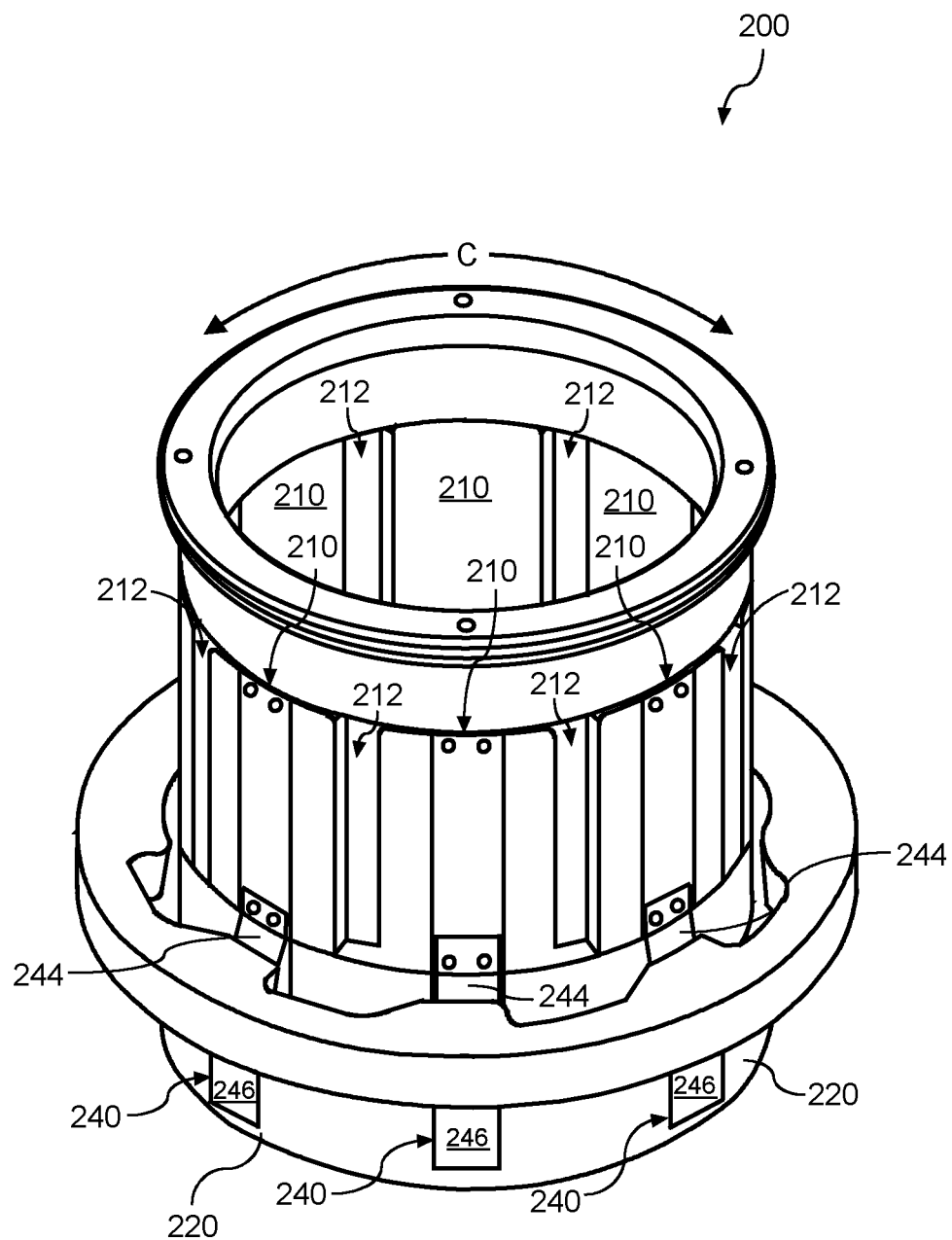
FIG. 5 depicts a configurable Faraday shield having a movable member in a second position according to example embodiments of the present disclosure.
Figure 6:
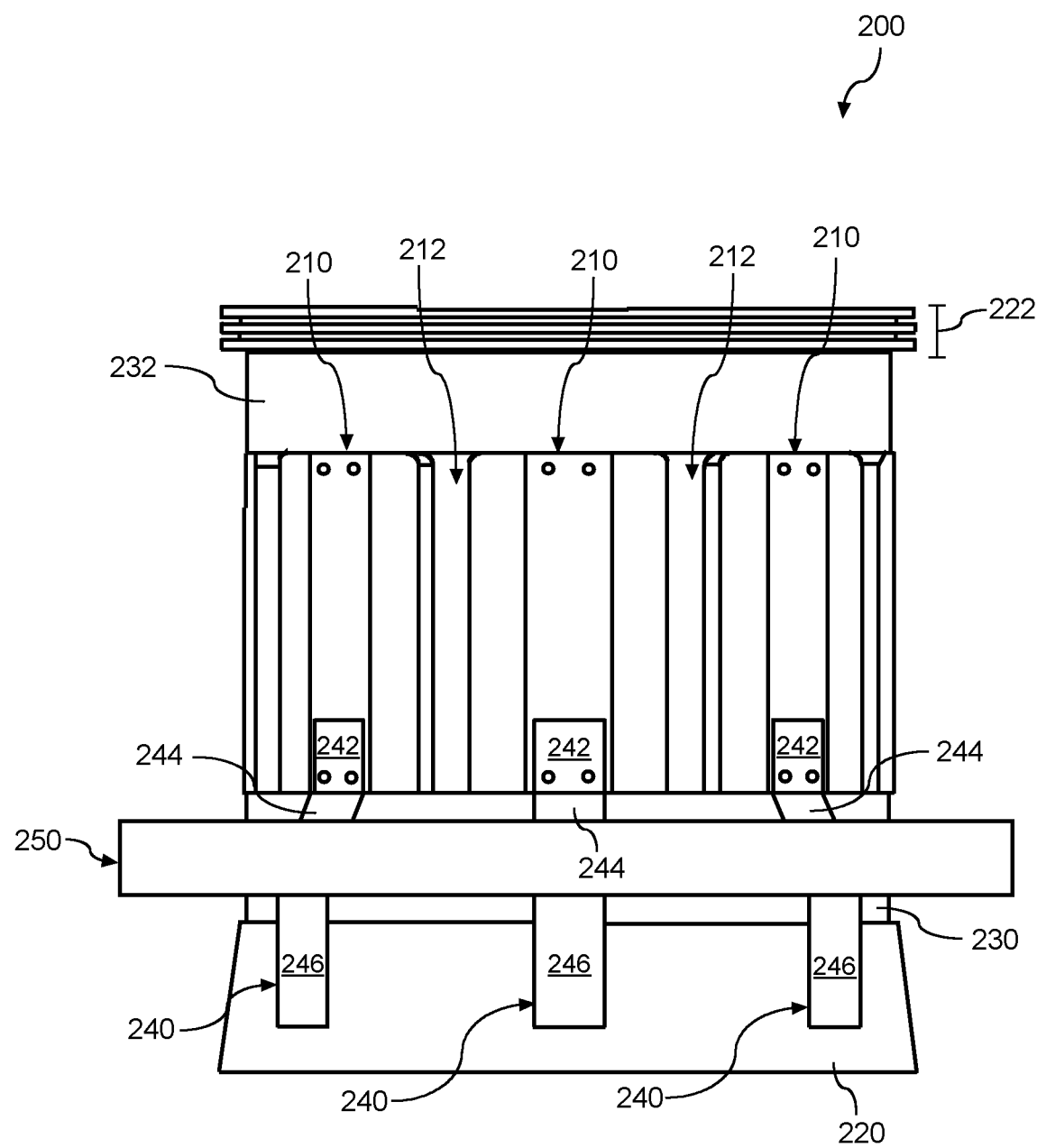
FIG. 6 depicts a side view of FIG. 5 according to example embodiments of the present disclosure.

Referring now to FIGS. 5 and 6, the configurable Faraday shield 200 is depicted with the locking member 250 in an intermediate third position according to an example embodiment of the present disclosure. In some implementations, the locking member 250 can be rotated about the axial direction A to move from the first position (FIGS. 2 and 4) to the intermediate third position. When the locking member 250 is in the intermediate third position, the plurality of conductive straps 240 are no longer positioned within a corresponding notch of the plurality of notches 252 defined by the locking member 250. Instead, the locking member 250 presses against the second portion 244 of each of the plurality of conductive straps 240. In some implementations, the locking member 250 can press the second portion 244 of each of the plurality of conductive straps 240 against the first dielectric spacer 230.

Figure 7:
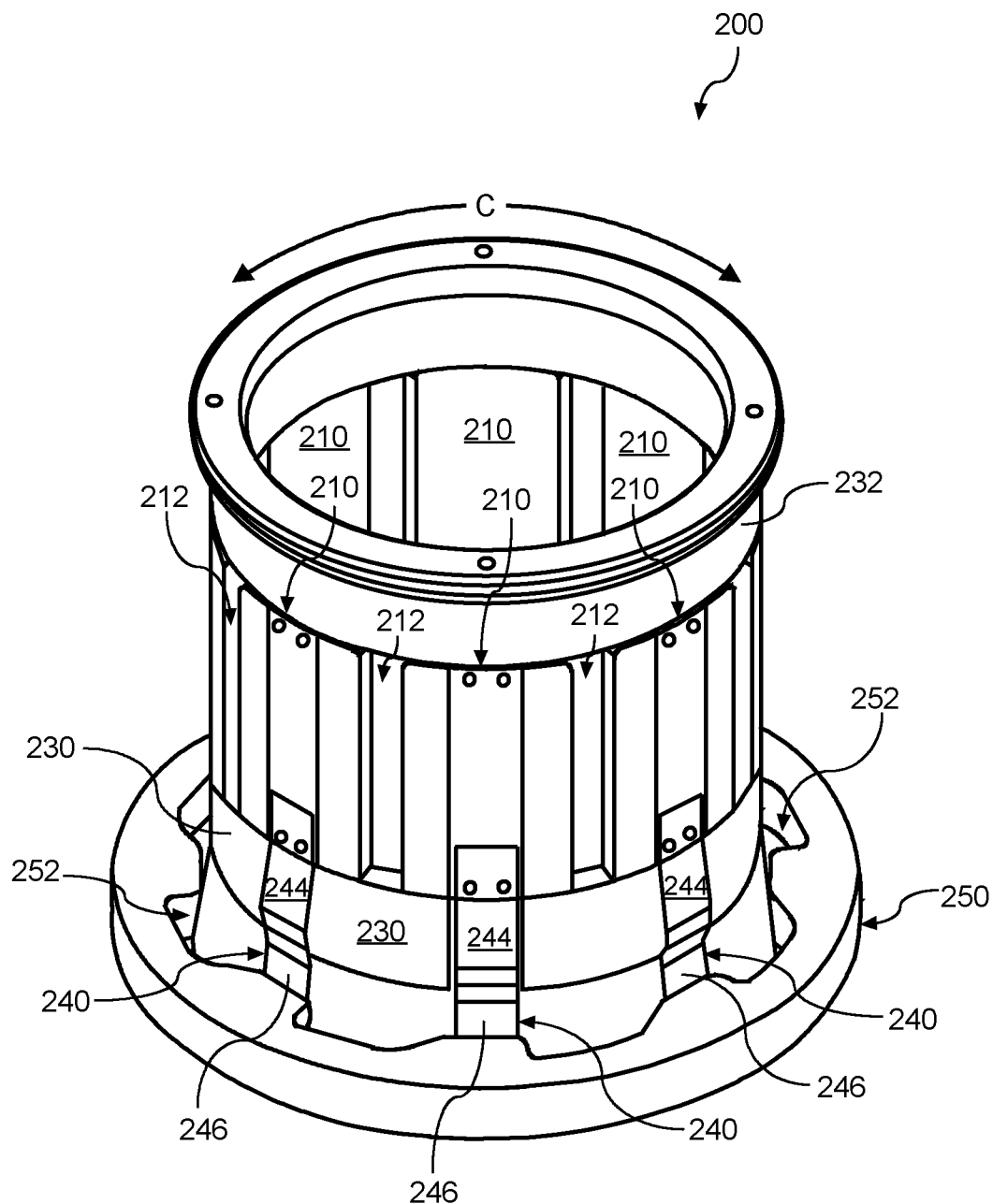
FIG. 7 depicts a configurable Faraday shield having a movable member in a third position according to example embodiments of the present disclosure.
Figure 8:
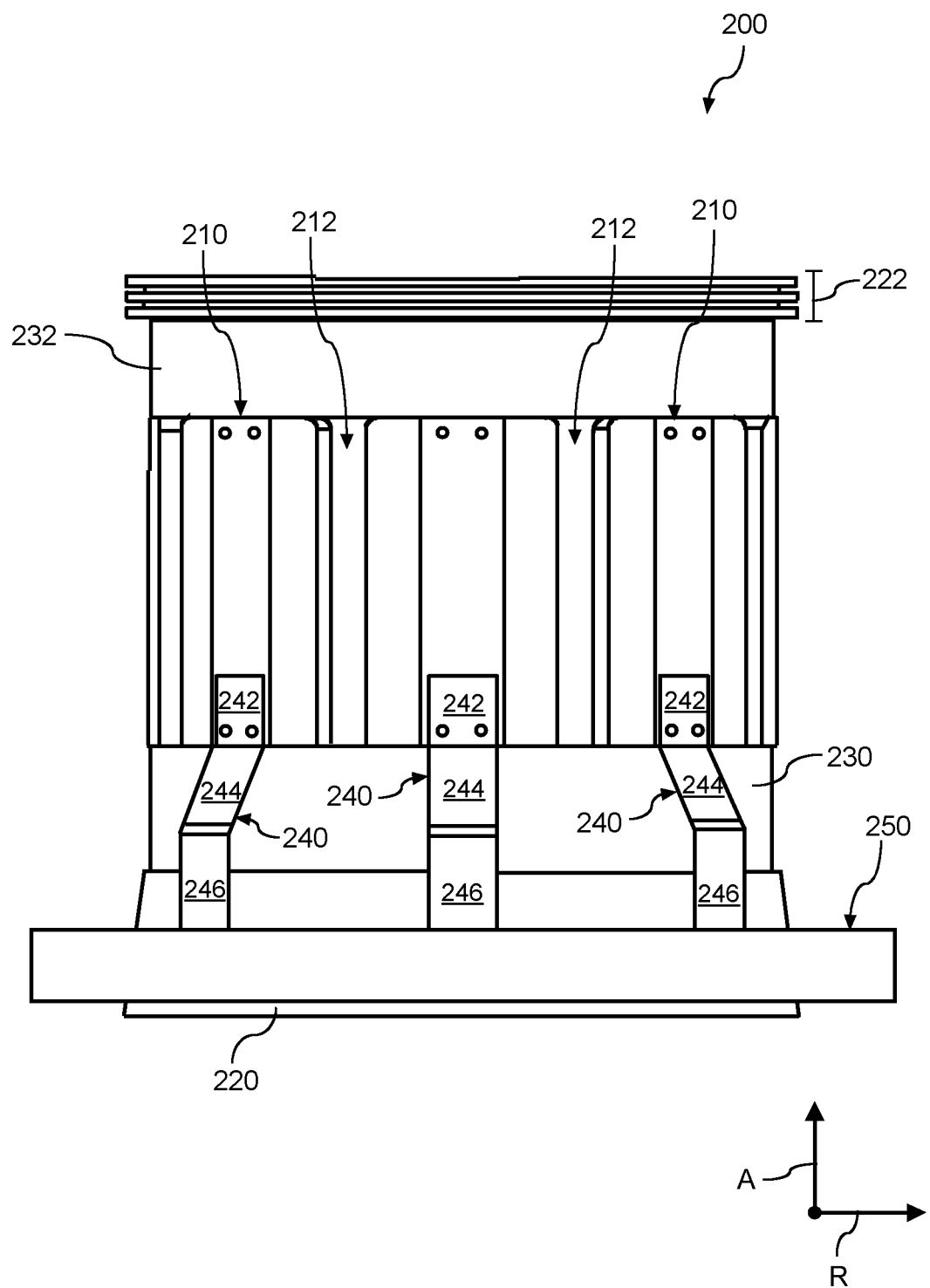
FIG. 8 depicts a side view of FIG. 7 according to example embodiments of the present disclosure.

Referring now to FIGS. 7 and 8, the configurable Faraday shield 200 is depicted with the locking member 250 in the second position according to an example embodiment of the present disclosure. In some implementations, the locking member 250 can move along the axial direction A in a first direction (e.g., downward) to move from the intermediate third position to the second position. When the locking member 250 is in the second position, the locking member 250 presses the third portion 246 of each of the plurality of conductive straps 240 against the first RF ground plane 220. In this manner, each of the plurality of ribs 210 can be electrically coupled to the first RF ground plane 220 via a corresponding conductive strap of the plurality of conductive straps 240. It should be understood that the locking member 250 can move along the axial direction A in a second direction (e.g., upward) that opposes the first direction to move from the second position to the intermediate third position (FIGS. 5 and 6).

In some implementations, the configurable Faraday shield 200 can include a second locking member (not shown) movable between the first position (FIGS. 2 and 4) and the second position to selectively couple the plurality of ribs 210 to the second RF ground plane 222. When the second locking member is in the first position, the plurality of ribs 210 can be decoupled from the second RF ground plane such that the configurable Faraday shield 200 is electrically floating (e.g., not electrically grounded). Conversely the plurality of ribs 210 can be electrically coupled to the second RF ground plane 222 via a corresponding conductive strap of the plurality of conductive strap 240 when the second locking member is in the second position. It should be understood that the configurable Faraday shield 200 can be fully electrically grounded when both locking members are in the second position such that the each of the plurality of ribs 210 is electrically coupled to the first RF ground plane 220 and the second RF ground plane 222 via a corresponding conductive strap of the plurality of conductive straps 240.

In some implementations, movement of the locking member 250 between the first position and the second position can be controlled manually by a user. For instance, the user can interact with one or more input devices (e.g., actuators) to provide user input associated with moving the locking member 250 from the first position to the second position, or vice versa. In alternative implementations, movement of the locking member 250 can be automated. For instance, one or more control devices (e.g., processors) can be configured to control movement of the locking member 250 based, at least in part, on data (e.g., pressure, temperature, etc.) associated with a plasma treatment process (e.g., strip, etch) being performed on a workpiece positioned within a processing chamber of a plasma processing apparatus.

Figure 9:
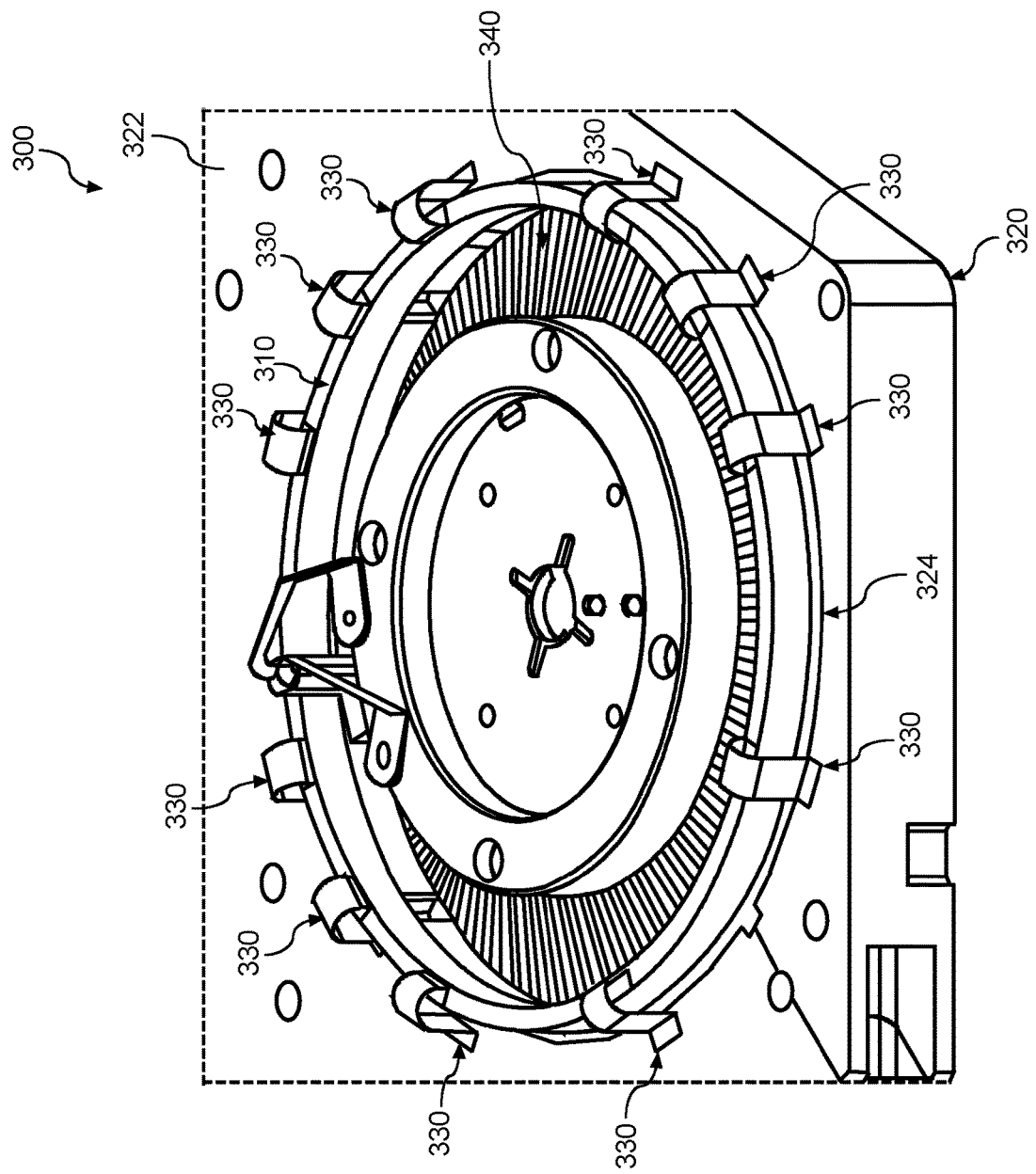
FIG. 9 depicts a locking member of a configurable Faraday shield in a first position such that the Faraday shield is electrically floating according to example embodiments of the present disclosure.
Figure 10:
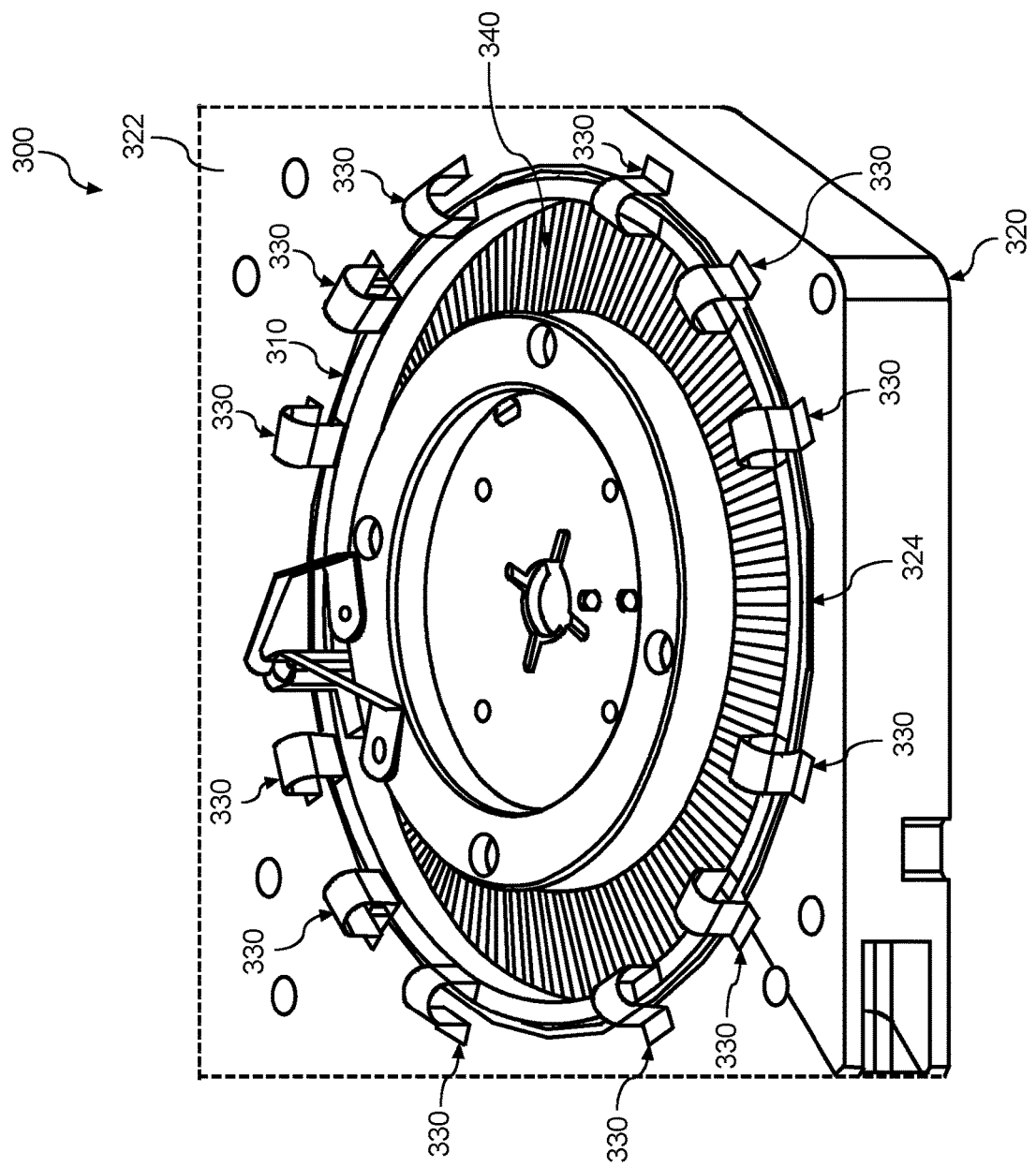
FIG. 10 depicts a locking member of a configurable Faraday shield in a second position such that the Faraday shield is electrically grounded according to example embodiments of the present disclosure.

Referring now to FIGS. 9 and 10, a configurable Faraday shield 300 having a locking member 310 movable between at least a first position (FIG. 9) and a second position (FIG. 10) is provided according to an example embodiment of the present disclosure. In some implementations, the locking member 310 can be coupled to a body 320 (e.g., top plate) via a plurality of conductive straps 330. For instance, a first end of each of the plurality of conductive straps 330 can be coupled to the locking member 310, whereas a second end of each of the plurality of conductive straps 330 can be coupled to a top surface 322 of the body 320. In some implementations, the plurality of conductive straps 330 can be integrally formed with the locking member 310. In such implementations, the locking member 310 and the plurality of conductive straps 330 can include any suitable metal.

When the locking member 310 is in the first position (FIG. 9), the locking member 310 is positioned outside of a cavity 324 defined by the body 320 (e.g., top plate) such that the locking member 310 does not contact (e.g., touch) a plurality of ribs 340 of the configurable Faraday shield 300 that are disposed within the cavity 324. In this manner, the plurality of ribs 340 can be decoupled from the body 320 such that the configurable Faraday shield 300 is electrically floating (e.g., not electrically grounded).

As shown, the locking member 310 can be lowered into the cavity 324 to move from the first position (FIG. 9) to the second position (FIG. 10). For instance, the locking member 310 can be lowered into the cavity 332 until the locking member 310 contacts (e.g., touches) the plurality of ribs 340. When the locking member 310 contacts the plurality of ribs 340, each of the plurality of ribs 340 can be electrically coupled to the body 320 (e.g., top plate) via the locking member 310 and the plurality of conductive straps 330. In this manner, the configurable Faraday shield 300 can be electrically grounded when the locking member 310 is in the second position.

Figure 11:
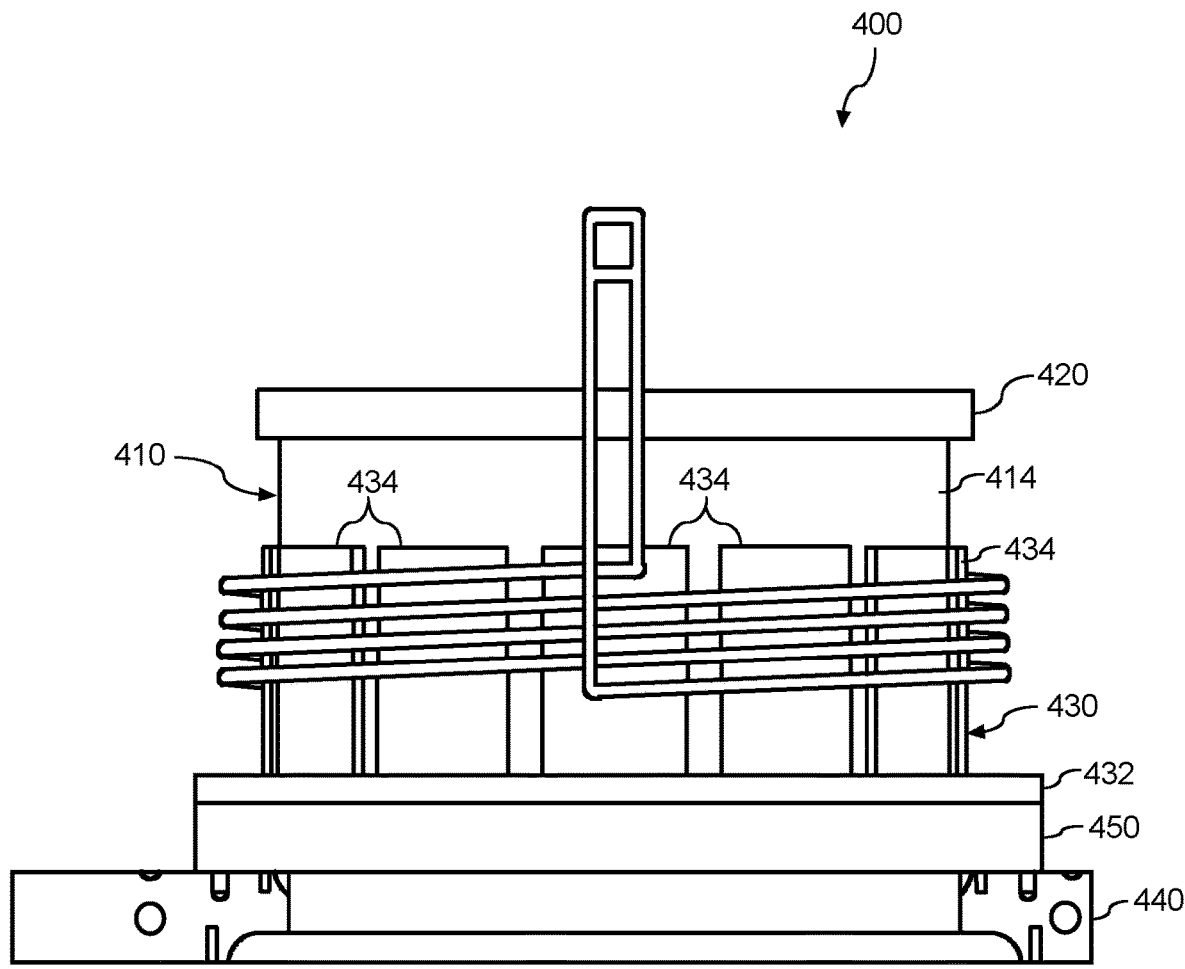
FIG. 11 depicts a configurable Faraday shield of a plasma processing apparatus electrically floating according to example embodiments of the present disclosure.
Figure 12:
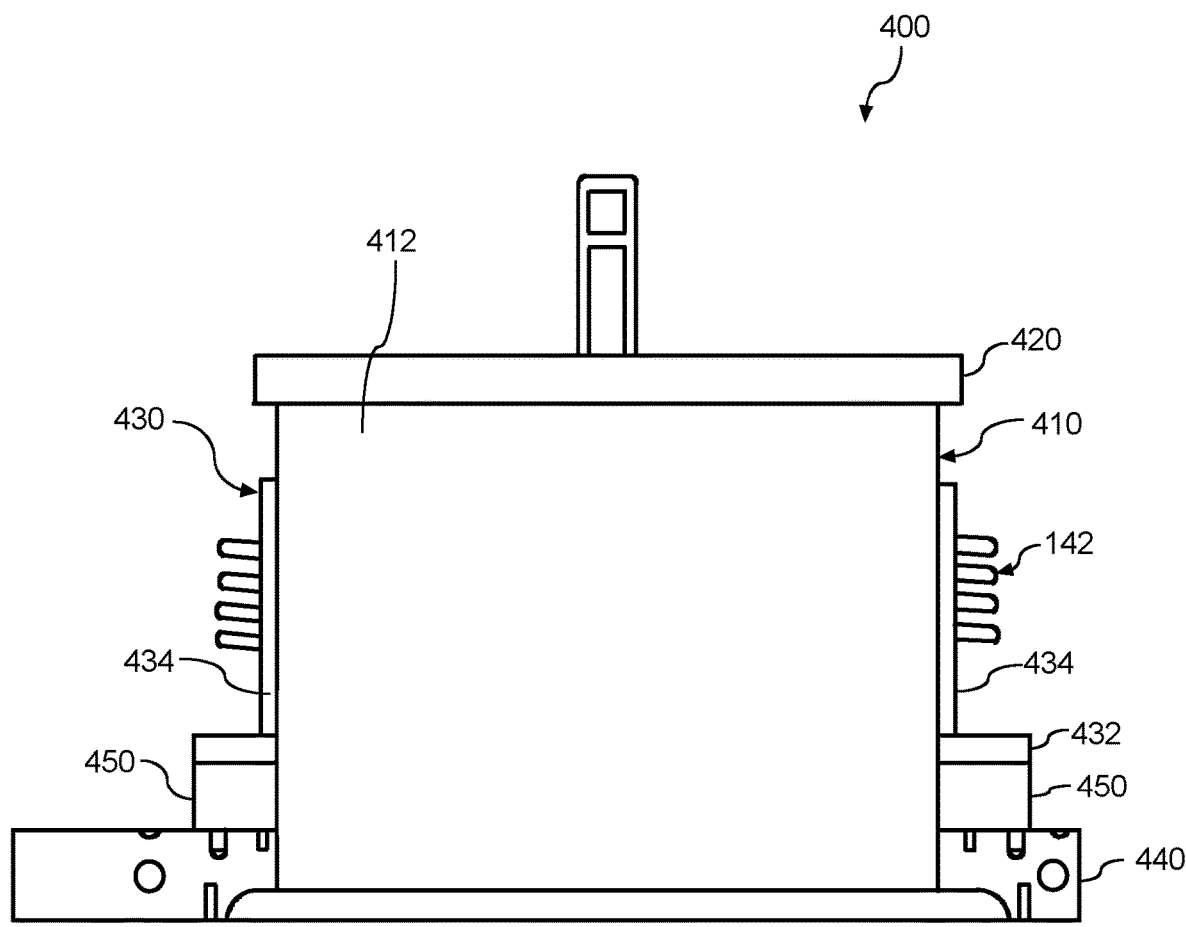
FIG. 12 depicts a cross-sectional view of FIG. 11 according to example embodiments of the present disclosure.
Figure 13:
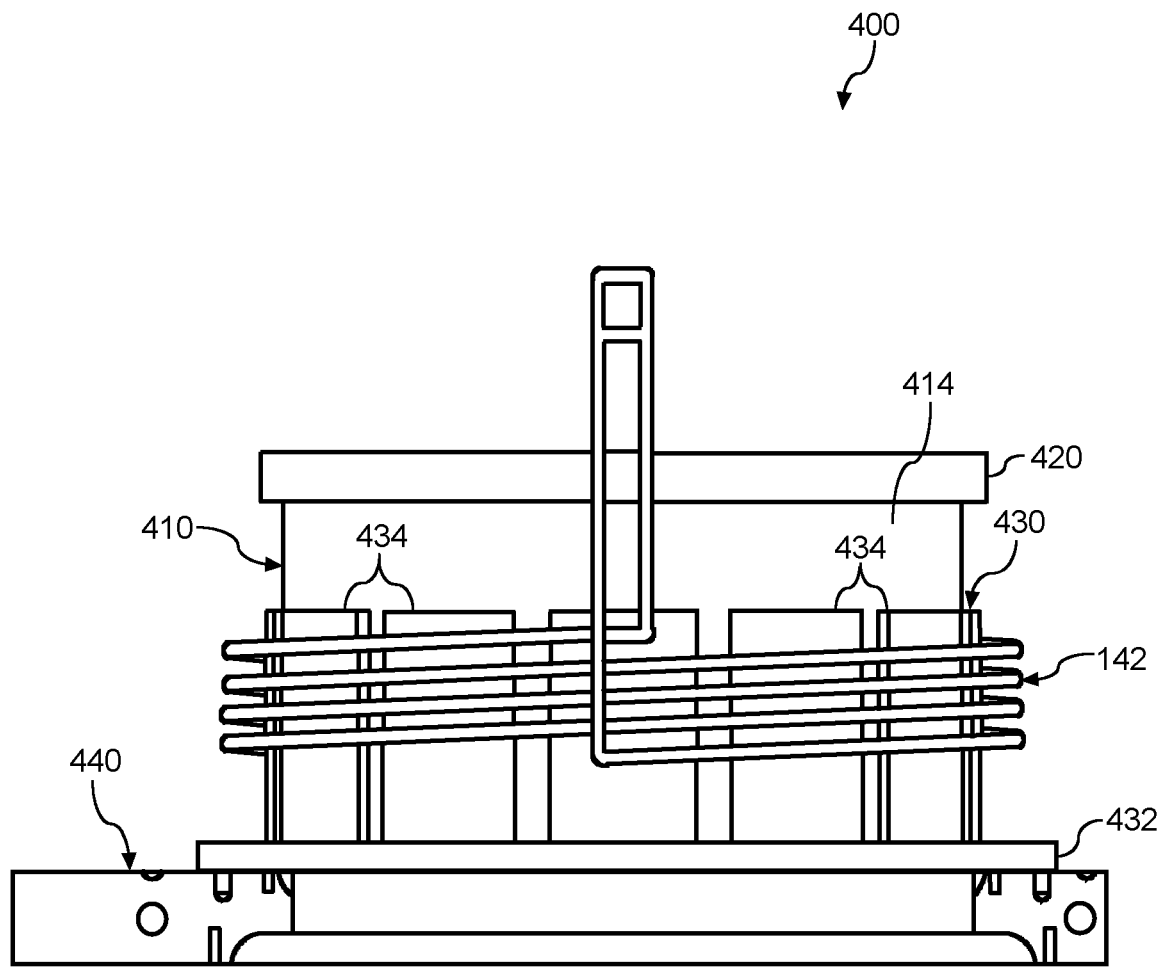
FIG. 13 depicts a configurable Faraday shield of a plasma processing apparatus electrically grounded according to example embodiments of the present disclosure.
Figure 13:
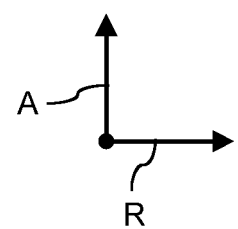

Referring now to FIGS. 11 through 13 a plasma processing apparatus 400 is provided according to example embodiments of the present disclosure. The plasma processing apparatus 400 can define an axial direction A, a radial direction R, and a circumferential direction. The plasma processing apparatus 400 includes a processing chamber 410 having an interior surface 412 and an exterior surface 414. In some implementations, the processing chamber 410 can be a plasma chamber.

In some implementations, the plasma processing apparatus 400 can include a cap 420. As shown, the cap 420 can be positioned such that the top plate 420 defines a ceiling of the processing chamber 410. In some implementations, a gas feed (e.g., showerhead) can extend into the processing chamber 410 via an opening defined by the cap 420. In this manner, gas can flow into the processing chamber 410 via the gas feed.

In some implementations, the plasma processing apparatus 400 can include the induction coil 142 discussed above with reference to FIG. 1. As shown, the induction coil 142 can surround a portion of the exterior surface 414 of the processing chamber 410. It should be understood that the induction 142 coil can be electrically coupled to a RF generator via a suitable matching network.

The plasma processing apparatus 400 can include a configurable Faraday shield 430 positioned between the induction coil 142 and the exterior surface 414 of the processing chamber 410. The configurable Faraday shield 430 can include a base 432. The configurable Faraday shield 430 can further include a plurality of ribs 434. As shown, each of the plurality of ribs 434 can extend from the base 432 such that each of the plurality of ribs 434 is substantially perpendicular (e.g., less than a 15 degree, less than a 10 degree, less than a 5 degree, less than a 1 degree, etc. difference from 90 degrees) to the base 432. Furthermore, the plurality of ribs 434 can be spaced apart from one another along the circumferential direction.

The configurable Faraday shield 430 can move along the axial direction A between at least a first position (FIGS. 11 and 12) and a second position (FIG. 13) to selectively couple the configurable Faraday shield 430 to a RF ground plane. For instance, in some implementations, the RF ground plane can include a top plate 440 of the plasma processing apparatus 400. When the configurable Faraday shield 430 is in the first position, the configurable Faraday shield 430 can be spaced apart from the top plate 440 along the axial direction A such that the configurable Faraday shield 430 is electrically floating (e.g., not electrically grounded). Conversely, when the configurable Faraday shield 430 is in the second position, the base 432 of the configurable Faraday shield 430 can contact (e.g., touch) the top plate 440 such that the configurable Faraday shield 430 is electrically grounded.

In some implementations, movement of the configurable Faraday shield 430 along the axial direction A between the first position (FIGS. 11 and 12) and the second position (FIG. 13) can be done manually. For instance, a user (e.g., technician) can open up a RF cage to gain access to the configurable Faraday shield 430. In such implementations, the user can move the configurable Faraday shield 430 along the axial direction A from the second position to the first position. Furthermore, once the configurable Faraday shield 430 is in the first position, the user can insert a spacer 450 between the top plate 440 and the base 432 of the configurable Faraday shield 430 to hold the configurable Faraday shield 430 in the first position.

It should be understood that the spacer 450 can include any suitable insulating material. For instance, in some implementations, the spacer 450 can include a ceramic material. In alternative implementations, the spacer 450 can include a plastic material (e.g., Teflon, polyetherimide, polyether ether ketone).

In alternative implementations, movement of the configurable Faraday shield 430 along the axial direction A between the first position (FIGS. 11 and 12) and the second position (FIG. 13) can be done automatically. For instance, in some implementations, the plasma processing apparatus can include an electric motor configured to drive movement of the configurable Faraday shield 430 along the axial direction A between the first position and the second position. In such implementations, the spacer 450 would not be needed. Instead, an air gap would be defined between the top plate 440 and the base 432 of configurable Faraday shield 430 when the configurable Faraday shield 430 when the configurable Faraday shield 430 is in the first position (FIGS. 11 and 12) such that the configurable Faraday shield 430 is electrically floating (e.g., not electrically grounded).

Figure 14:
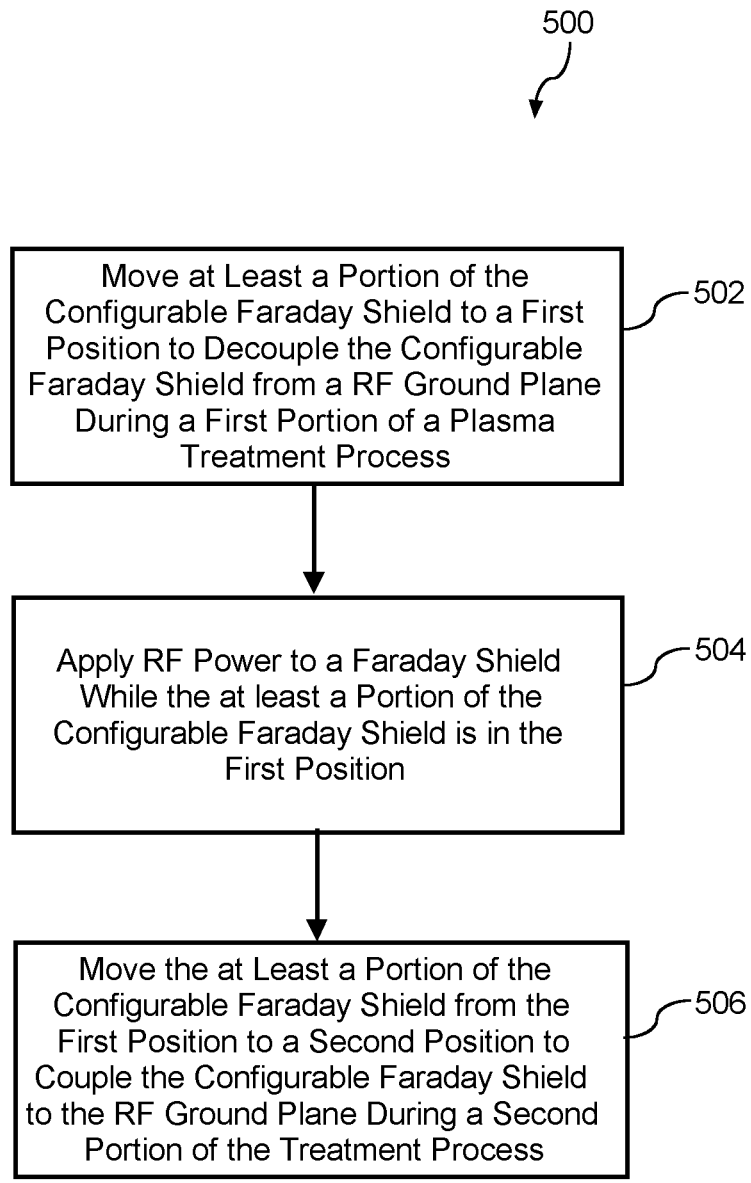
FIG. 14 depicts a flow diagram of a method of controlling operation of a configurable Faraday shield according to example embodiments of the present disclosure.

Referring now to FIG. 14, a flow diagram of a method 500 for controlling operation of a pressure control system for a multi-head pump of a plasma processing apparatus is provided according to example embodiments of the present disclosure. It should be appreciated that the method 500 can be implemented using the configurable Faraday shield 200, 400 discussed above with reference to FIGS. 2 through 8 and FIGS. 11-13, respectively. FIG. 14 depicts steps performed in a particular order for purposes of illustration and discussion. Those of ordinary skill in the art, using the disclosures provided herein, will understand that various steps of the method 500 may be adapted, modified, rearranged, performed simultaneously, or modified in various ways without deviating from the scope of the present disclosure.

At (502), the method 500 can include moving at least a portion of the configurable Faraday shield to a first position to decouple the configurable Faraday shield from a radio frequency ground plane such that the configurable Faraday shield is electrically floating during a first portion (e.g., plasma striking window) of a plasma treatment process (e.g., strip, etch) for a workpiece disposed within a processing chamber of a plasma processing apparatus.

In some implementations, moving at least a portion of the configurable Faraday shield can include moving a locking member of the configurable Faraday shield to the first position to decouple a plurality of ribs of the configurable Faraday shield from the radio frequency ground plane such that the configurable Faraday shield is electrically floating during the first portion (e.g., plasma striking window) of the plasma treatment process (e.g., strip, etch) for a workpiece disposed within a processing chamber of a plasma processing apparatus. For instance, in some implementations, moving the locking member to the first position can include rotating the locking member about an axis. Alternatively, or additionally, moving the locking member to the first position can include moving (e.g., translating) the locking member along the axis.

In alternative implementations, moving at least a portion of the configurable Faraday shield to the first position can include moving the entire configurable Faraday shield along an axis (e.g., axial direction) to the first position. For instance, in some implementations, a user can manually move the configurable Faraday shield to the first position. In alternative implementations, the configurable Faraday shield can be operatively coupled to an electric motor such that the electric motor can be operated to move the configurable Faraday shield to the first position.

At (504), the method 500 can include applying RF power to the Faraday shield while the locking member is in the first position. For instance, in some implementations, the Faraday shield can be electrically coupled to a RF power source via a suitable matching network. In this manner, RF power can be applied to the Faraday shield to, for instance, capacitively coupe the Faraday shield to an induction coil. It should be understood, however, that the RF power can be applied to capacitively couple the Faraday shield to any suitable device. It should be appreciated that a process window associated with a workpiece being processed by a plasma processing apparatus can be expanded by applying RF power to the Faraday shield while the Faraday shield is electrically floating.

At (506), the method 500 can include moving at least a portion of the configurable Faraday shield from the first position to a second position to couple the configurable Faraday shield to the radio frequency ground plane such that the configurable Faraday shield is electrically grounded during a second portion (e.g., plasma sustain window) of the plasma treatment process (e.g., strip, etch).

In some implementations, moving at least a portion of the configurable Faraday shield from the first position to the second position can include moving a locking member of the configurable Faraday shield from the first position to the second position. For instance, in some implementations, moving the locking member from the first position to the second position can include moving (e.g., translating) the locking member along an axis and rotating the locking member about the axis. In some implementations, rotating the locking member about the axis can occur contemporaneously with moving the locking member along the axis.

In alternative implementations, moving at least a portion of the configurable Faraday shield from the first position to a second position can include moving the entire configurable Faraday shield along an axis (e.g., axial direction) from the first position to the second position. For instance, in some implementations, a user can manually move the configurable Faraday shield from the first position to the second position. In alternative implementations, the configurable Faraday shield can be operatively coupled to an electric motor such that the electric motor can be operated to move the configurable Faraday shield to the first position.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A configurable Faraday shield defining an axial direction, a circumferential direction, and a radial direction, the configurable Faraday shield comprising:
   a plurality of ribs, each of the ribs spaced apart from one another along the circumferential direction, the plurality of ribs coupled between a first radio frequency ground plane and a second radio frequency ground plane;
   a plurality of conductive straps; and
   a locking member movable between at least a first position and a second position to selectively couple each of the plurality of ribs to the first radio frequency ground plane via a corresponding conductive strap of the plurality of conductive straps; wherein the locking member comprises a ring defining a plurality of notches.

2. The configurable Faraday shield of claim 1, wherein each of the plurality of conductive straps is coupled to a corresponding rib of the plurality of ribs.

3. The configurable Faraday shield of claim 1, wherein the locking member rotates about the axial direction and translates along the axial direction to move between the first position and the second position.

4. The configurable Faraday shield of claim 1, wherein each of the plurality of conductive straps comprise:
   a first portion coupled to a corresponding rib of the plurality of ribs;
   a second portion that is bent relative to the first portion, and
   a third portion that is bent relative to the second portion, the third portion being substantially parallel to the first portion.

5. The configurable Faraday shield of claim 4, wherein the second portion is bent relative to the first portion at an angle that is greater 90 degrees.

6. The configurable Faraday shield of claim 4, wherein at least one of the plurality of conductive straps comprises beryllium copper.

7. The configurable Faraday shield of claim 4, further comprising:
   a dielectric spacer positioned between the first radio frequency ground plane and the plurality of ribs along the axial direction.

8. The configurable Faraday shield of claim 7, wherein:
   when the locking member is in the first position, each of the plurality of conductive straps is positioned within a corresponding notch of a plurality of notches defined by the locking member such that the plurality of conductive straps are spaced apart from the first radio frequency ground plane; and
   when the locking member is in the second position, the locking member presses the third portion of each of the plurality of conductive straps against the first radio frequency ground plane.

9. The configurable Faraday shield of claim 7, wherein the locking member is in an intermediate third position, the locking member presses the second portion of each of the plurality of conductive straps against the dielectric spacer.

* * * * *